US011217597B2

(12) United States Patent
Lin et al.

(10) Patent No.: US 11,217,597 B2
(45) Date of Patent: Jan. 4, 2022

(54) SEMICONDUCTOR DEVICE AND METHOD OF MANUFACTURING THE SAME

(71) Applicant: TAIWAN SEMICONDUCTOR MANUFACTURING CO., LTD., Hsinchu (TW)

(72) Inventors: Meng-Han Lin, Hsinchu (TW); Chih-Ren Hsieh, Changhua (TW); Ching-Wen Chan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 70 days.

(21) Appl. No.: 16/585,809

(22) Filed: Sep. 27, 2019

(65) Prior Publication Data
US 2020/0027890 A1    Jan. 23, 2020

Related U.S. Application Data

(62) Division of application No. 15/698,469, filed on Sep. 7, 2017, now Pat. No. 10,770,469.
(Continued)

(51) Int. Cl.
*H01L 27/11548* (2017.01)
*H01L 27/11526* (2017.01)
(Continued)

(52) U.S. Cl.
CPC .. *H01L 27/11548* (2013.01); *H01L 27/11526* (2013.01); *H01L 27/11534* (2013.01); *H01L 27/11519* (2013.01)

(58) Field of Classification Search
CPC ......... H01L 27/11549; H01L 27/11526; H01L 27/11534
See application file for complete search history.

(56) References Cited

U.S. PATENT DOCUMENTS

| 5,400,278 A | * | 3/1995 | Kunori | ................... | H01L 27/105 |
| | | | | | 257/499 |
| 6,346,366 B1 | * | 2/2002 | Chu | ...................... | H01L 21/765 |
| | | | | | 257/409 |

(Continued)

FOREIGN PATENT DOCUMENTS

| CN | 101136375 A | 3/2008 |
| CN | 105374876 A | 3/2016 |

(Continued)

OTHER PUBLICATIONS

Office Action dated Jun. 6, 2018 from German Patent Application No. 10 2017 122 526.9 (8 pages).
(Continued)

*Primary Examiner* — Dale E Page
*Assistant Examiner* — Quovaunda Jefferson
(74) *Attorney, Agent, or Firm* — McDermott Will & Emery LLP

(57) ABSTRACT

In a method of manufacturing a semiconductor device, the semiconductor device includes a non-volatile memory formed in a memory cell area and a ring structure area surrounding the memory cell area. In the method, a protrusion of a substrate is formed in the ring structure area. The protrusion protrudes from an isolation insulating layer. A high-k dielectric film is formed, thereby covering the protrusion and the isolation insulating layer. A poly silicon film is formed over the high-k dielectric film. The poly silicon film and the high-k dielectric film are patterned. Insulating layers are formed over the patterned poly silicon film and high-k dielectric film, thereby sealing the patterned high-k dielectric film.

20 Claims, 18 Drawing Sheets

Related U.S. Application Data

(60) Provisional application No. 62/439,739, filed on Dec. 28, 2016.

(51) Int. Cl.
  *H01L 27/11534* (2017.01)
  *H01L 27/11519* (2017.01)

(56) References Cited

U.S. PATENT DOCUMENTS

| | | | |
|---|---|---|---|
| 6,429,068 B1 | 8/2002 | Divakaruni et al. | |
| 6,525,398 B1* | 2/2003 | Kim | H01L 21/768 |
| | | | 257/529 |
| 7,494,895 B2 | 2/2009 | Yang et al. | |
| 9,893,191 B2 | 2/2018 | Wen et al. | |
| 2005/0077590 A1* | 4/2005 | Swanson | H01L 29/402 |
| | | | 257/484 |
| 2007/0075376 A1 | 4/2007 | Kono | |
| 2007/0102731 A1 | 5/2007 | Sakagami | |
| 2008/0054362 A1 | 3/2008 | Ogawa et al. | |
| 2008/0096388 A1* | 4/2008 | Matsumoto | H01L 21/76819 |
| | | | 438/689 |
| 2010/0295111 A1 | 11/2010 | Kawashima | |
| 2011/0057297 A1* | 3/2011 | Lee | H01L 23/562 |
| | | | 257/620 |
| 2011/0260286 A1 | 10/2011 | Lee et al. | |
| 2013/0248997 A1 | 9/2013 | Jang et al. | |
| 2014/0015092 A1 | 1/2014 | Aquilino et al. | |
| 2015/0084111 A1* | 3/2015 | Wu | H01L 27/11548 |
| | | | 257/316 |
| 2015/0099353 A1 | 4/2015 | Jee et al. | |
| 2016/0056295 A1 | 2/2016 | Wen et al. | |
| 2018/0182772 A1 | 6/2018 | Lin et al. | |

FOREIGN PATENT DOCUMENTS

| | | |
|---|---|---|
| JP | 2004-534403 A | 11/2004 |
| KR | 10-2006-0001308 A | 1/2006 |
| KR | 10-0541054 B1 | 1/2006 |
| KR | 10-2007-0038445 A | 4/2007 |
| KR | 10-0880341 B1 | 1/2009 |
| KR | 10-2016-022753 | 3/2018 |
| TW | 200719471 A | 5/2007 |
| TW | I355715 B | 1/2012 |

OTHER PUBLICATIONS

Office Action dated Jun. 17, 2018 from Korean Patent Application No. 10-2017-0140019 (4 pages).
Notice of Allowance issued in related Korean Patent Application No. 10-2017-0140019, dated Feb. 11, 2019.
Non-Final Office Action issued in related U.S. Appl. No. 15/698,469, dated Jul. 9, 2019.
Notice of Allowance issued in related U.S. Appl. No. 15/698,469, dated May 1, 2020.

* cited by examiner

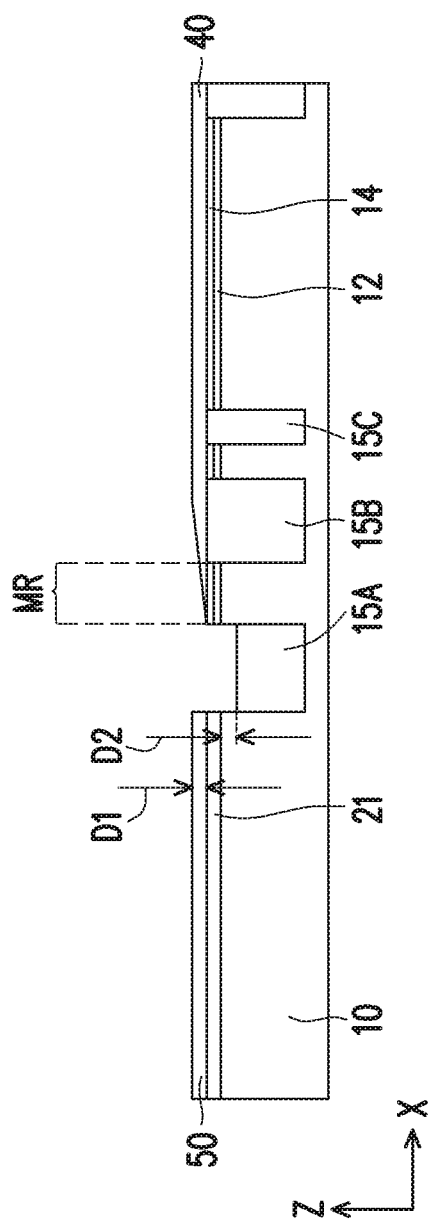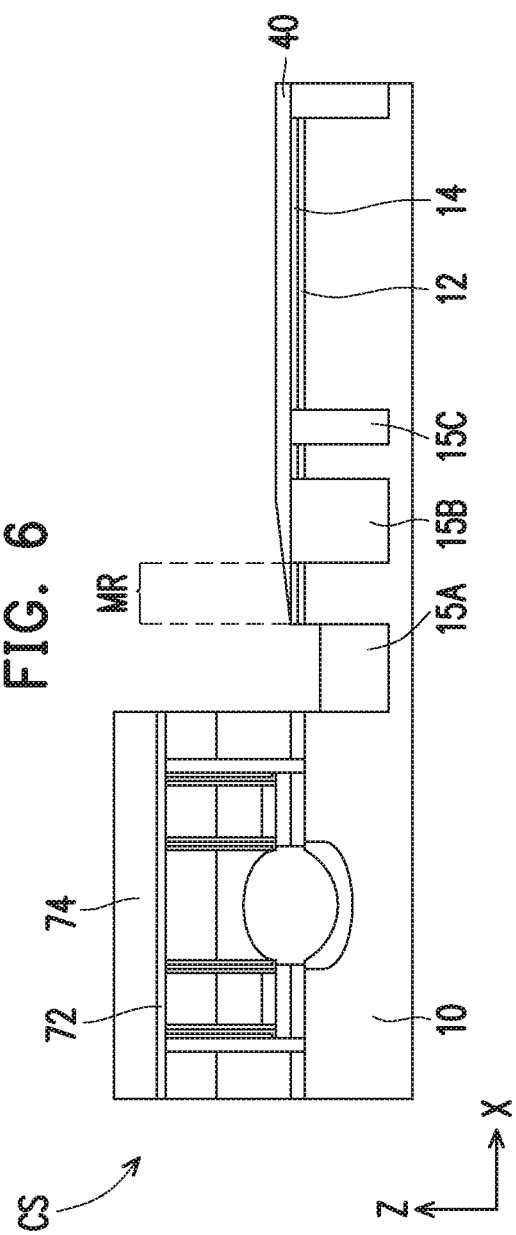

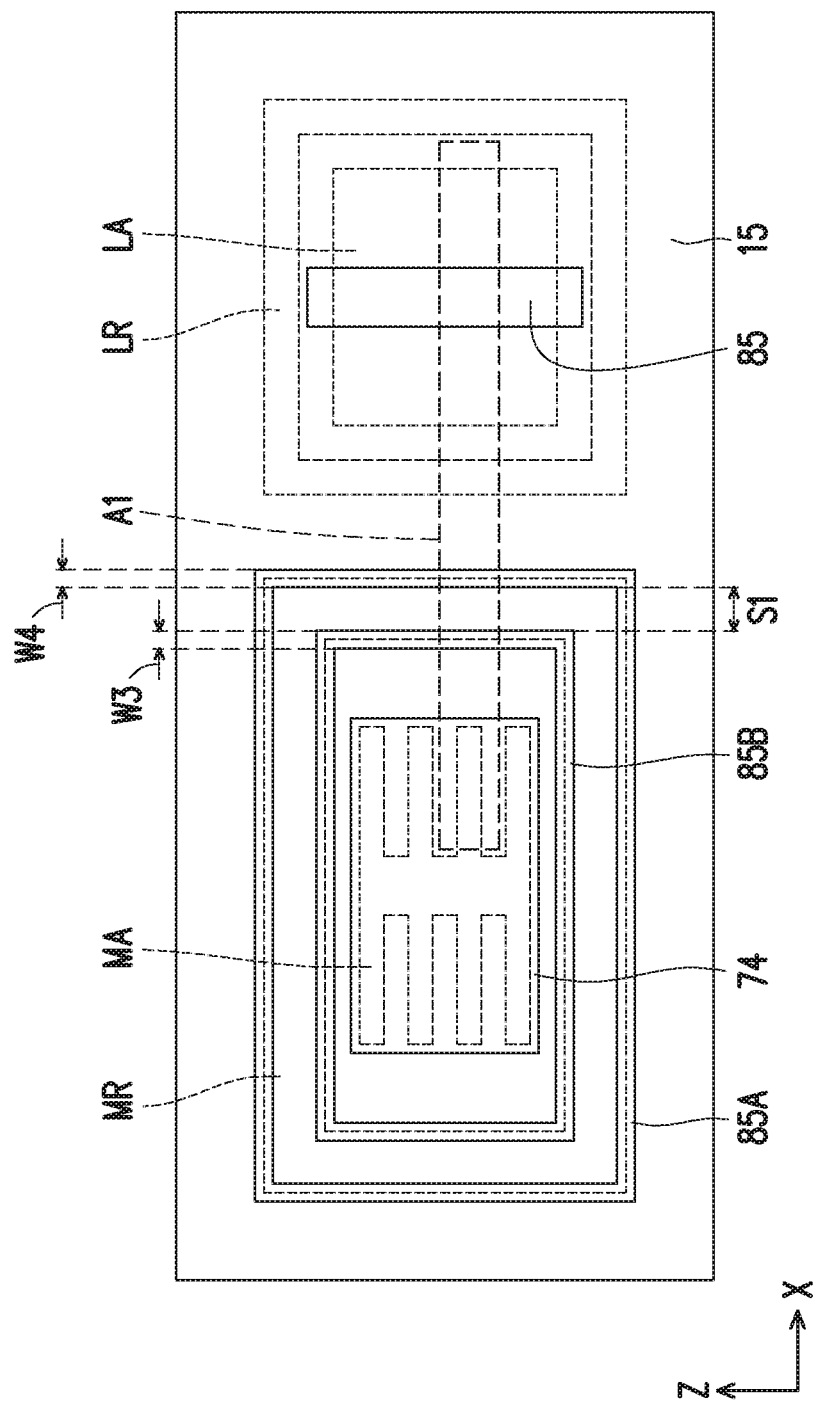

SEMICONDUCTOR DEVICE AND METHOD OF MANUFACTURING THE SAME

CROSS-REFERENCE TO RELATED APPLICATIONS

This application is a divisional of application Ser. No. 15/698,469 filed on Sep. 7, 2017, which claims priority to U.S. Provisional Patent Application 62/439,739 filed Dec. 28, 2016, the entire disclosure of each of which is incorporated herein by reference.

TECHNICAL FIELD

The disclosure relates to semiconductor integrated circuits, more particularly to semiconductor devices including non-volatile memory cells and peripheral devices, and manufacturing processes thereof.

BACKGROUND

As the semiconductor industry has progressed into nanometer technology process nodes in pursuit of higher device density, higher performance, and lower costs, there have been challenges in controlling flatness of an underlying layer in view of lithography operations. A flash memory utilizing non-volatile memory (NVM) cells has continually been scaled down and is embedded in advanced CMOS logic integrated circuits (ICs) for a smart card and automotive applications. In particular, integration of manufacturing processes for the NVM cells and manufacturing processes for peripheral logic circuits become more complex and important.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 6 shows a cross sectional view illustrating one stage of a sequential manufacturing process of a semiconductor device according to embodiments of the present disclosure.

FIG. 7 shows a cross sectional view illustrating one stage of a sequential manufacturing process of a semiconductor device according to embodiments of the present disclosure.

FIG. 11A shows a plan view (a layout) and FIG. 11B shows a cross sectional view, illustrating one stage of a sequential manufacturing process of a semiconductor device according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the present embodiment, a semiconductor device includes non-volatile memory (NVM) cells and peripheral devices (e.g., logic circuits). The NVM cells generally use a stacked structure in which plural layers, such as polysilicon layers, are stacked, while the peripheral devices generally include field effect transistors (FETs) having a single polysilicon layer. In various embodiments of the present disclosure, a ring structure (a guard ring) made by an active region (diffusion region) is provided for at least the NVM area.

Figure 1:
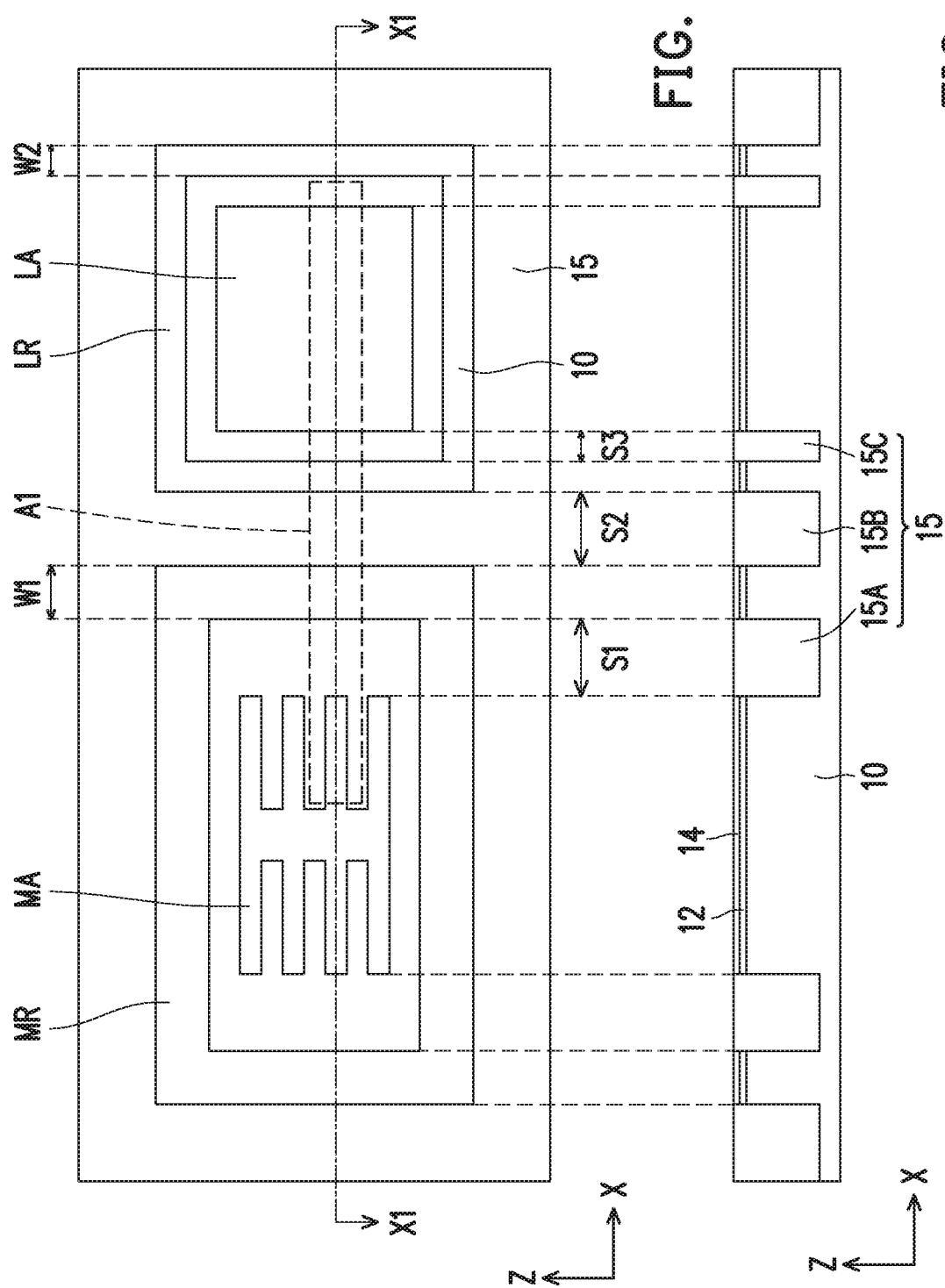
FIG. 1A shows a plan view (a layout) and FIG. 1B shows a cross sectional view, illustrating one stage of a sequential manufacturing process of a semiconductor device according to embodiments of the present disclosure.
Figure 2:
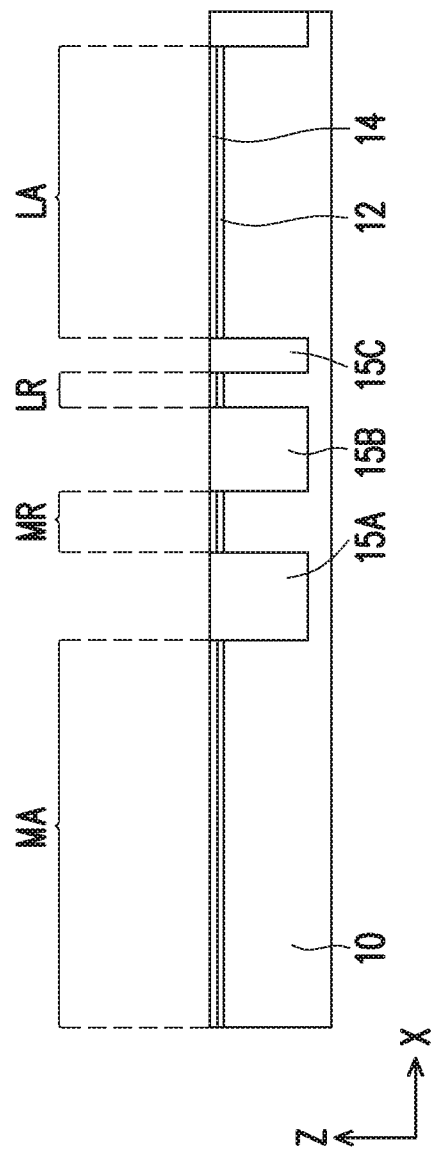
FIG. 2 shows a cross sectional view illustrating one stage of a sequential manufacturing process of a semiconductor device according to embodiments of the present disclosure.

FIG. 1A shows a plan view (a layout) and FIG. 1B shows a cross sectional view, illustrating one stage of a sequential manufacturing process of a semiconductor device according to some embodiments of the present disclosure. FIG. 1B shows a cross sectional view along the line X1-X1 of FIG. 1A, which illustrates one stage of the semiconductor manufacturing process according to some embodiments of the present application. FIG. 2 shows a cross sectional view along the line X1-X1 in the area A1 of FIG. 1A. Similarly, FIGS. 3-7, 9, 10, 11B, 12 and 13 are cross sectional views corresponding to the line X1-X1 in the area A1 of FIG. 1A. In some embodiments, an NVM ring structure labeled as MR surrounds the NVM cell array area MA and a peripheral ring structure area LR surrounds the peripheral logic circuit are LA, as shown in FIG. 1A.

In some embodiments, prior to fabricating the NVM cells and the peripheral devices (e.g., transistors), a substrate in the NVM cell area is etched to make a "step" between the NVM cell area and the peripheral device area. The step height corresponds to the height difference when an interlayer dielectric (ILD) layer is formed if the step is otherwise not formed. In the following embodiments, the step height is not illustrated for simplicity.

As shown in FIGS. 1A and 1B, a pad oxide layer 12 is formed on the substrate 10 and a nitride layer 14 is further formed on the pad oxide layer 12. In an embodiment, the substrate 10 includes silicon. The substrate 10 is, for example, a p-type silicon substrate with an impurity concentration being in a range from about $1 \times 10^{15}$ cm$^{-3}$ and about $5 \times 10^{15}$ cm$^{-3}$. In other embodiments, The substrate includes an n-type silicon substrate with an impurity concentration being in a range from about $1 \times 10^{15}$ cm$^{-3}$ and about $5 \times 10^{15}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In an embodiment, the substrate 10 includes a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer 12 includes thermally grown silicon oxide, and the nitride layer 14 includes silicon nitride (SiN). The silicon oxide and the silicon nitride can be formed by using a furnace or chemical vapor deposition (CVD), or other suitable film formation operations. The thickness of the pad oxide layer 12 is in a range from about 5 nm to about 20 nm and the thickness of the nitride layer 14 is in a range from about 50 nm to about 100 nm in some embodiments.

By using a patterning operation, the pad oxide layer 12 and the nitride layer 14 are patterned into a mask pattern. By using the mask pattern as an etching mask, the substrate 10 is trench etched, and then an insulating material is formed in the trench, thereby forming isolation insulating layers (shallow trench isolation) 15 (e.g., 15A, 15B and 15C). The insulating material for the isolation insulating layer 15 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The isolation insulating layer 15 may be SOG, SiO, SiON, SiOCN or fluorine-doped silicate glass (FSG). The isolation insulating layer 15 may be doped with boron and/or phosphorous. Further, a planarization operation, such as a chemical mechanical polishing (CMP) method, is performed, thereby exposing the nitride layer 14, as shown in FIGS. 1A and 1B.

As shown in FIG. 1A, frame shaped nitride layers 14 surround the memory cell area MA and the logic circuit area LA, respectively. The width W1 of the memory cell ring structure MA is in a range from about 20 nm to about 1000 nm in some embodiments. The width W2 of the logic area ring structure LR is in a range from about 20 nm to about 1000 nm in some embodiments. The distance S1 of the isolation insulating layer 15A (a distance between the ring structure and the memory cell area) is in a range from about 50 nm to 10000 nm in some embodiments. The distance S2 of the isolation insulating layer 15B (a distance between the memory cell ring structure MA and the logic area ring structure LR) is in a range from about 50 nm to 10000 nm in some embodiments. The distance S3 of the isolation insulating layer 15C (a distance between the logic area ring structure LR and the logic circuit area LA) is in a range from about 20 nm to 10000 nm in some embodiments.

Figure 3:
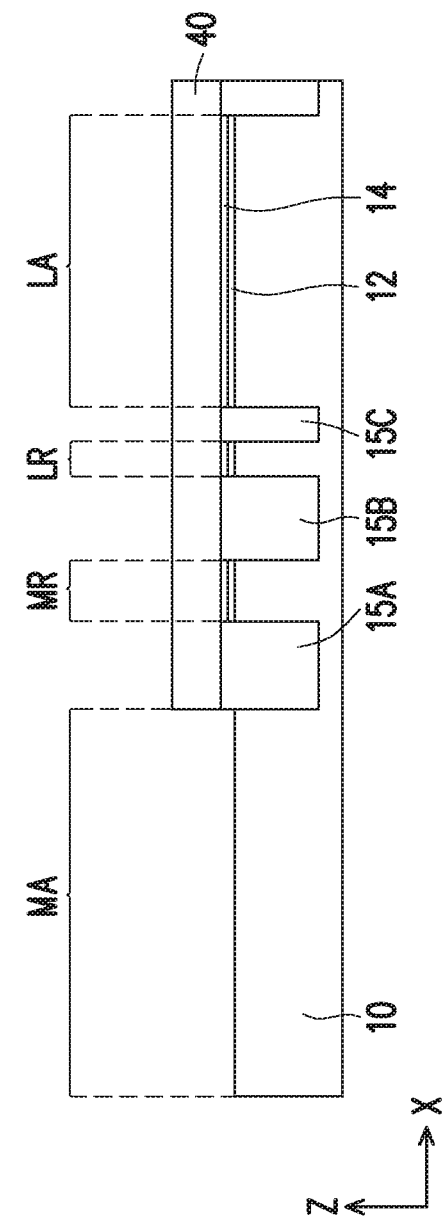
FIG. 3 shows a cross sectional view illustrating one stage of a sequential manufacturing process of a semiconductor device according to embodiments of the present disclosure.

Then, as shown in FIG. 3, a hard mask layer 40 is formed and patterned by lithography and etching operations so as to expose the memory cell area MA. The hard mask layer 40 is made of, for example, SiN, SiO$_2$, SiON, SiOC, SiC, or any other suitable material.

Figure 4:
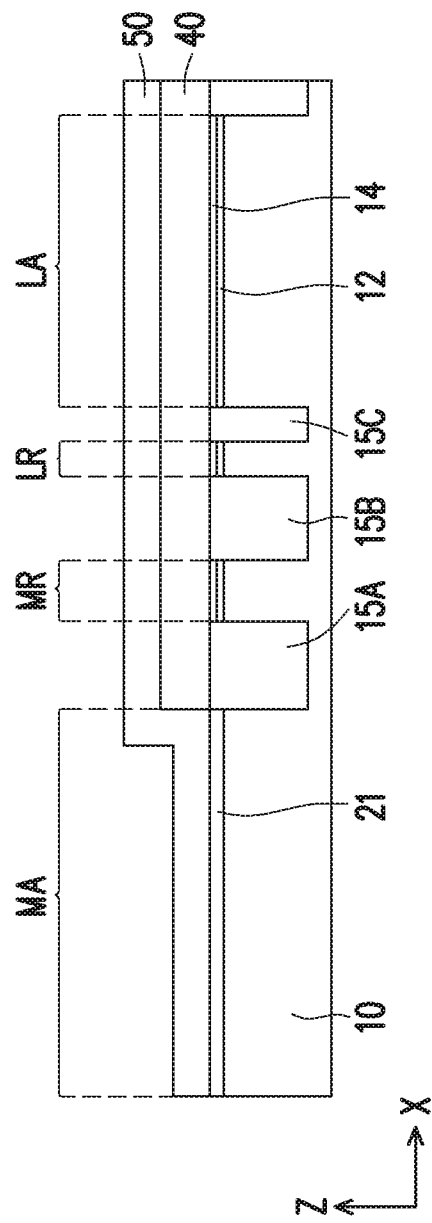
FIG. 4 shows a cross sectional view illustrating one stage of a sequential manufacturing process of a semiconductor device according to embodiments of the present disclosure.

Further, as shown in FIG. 4, a first dielectric layer 21 and a first polysilicon layer 50 are formed. The first dielectric layer 21 is utilized as a tunnel oxide layer for the NVM cells and is made of silicon oxide. The thickness of the first dielectric layer 21 is in a range from about 1 nm to about 50 nm in some embodiments. The first dielectric layer 21 can be formed by thermal oxidation or CVD.

The first polysilicon layer 50 can be formed by CVD. The thickness of the first polysilicon layer 50 as deposited is in a range from about 10 nm to about 300 nm in some embodiments. Then, the thickness of the first polysilicon layer 50 is reduced by a planarization operation, such as a chemical mechanical polishing (CMP) method or an etch-back method, in some embodiments. After the planarization operation, the thickness of the first polysilicon layer 50 is in a range from about 10 nm to about 200 nm in some embodiments. The first polysilicon layer 50 is appropriately doped with impurities and is utilized for floating gates of the NVM cells. The polysilicon layer 50 may be replaced with an amorphous silicon layer.

Figure 5:
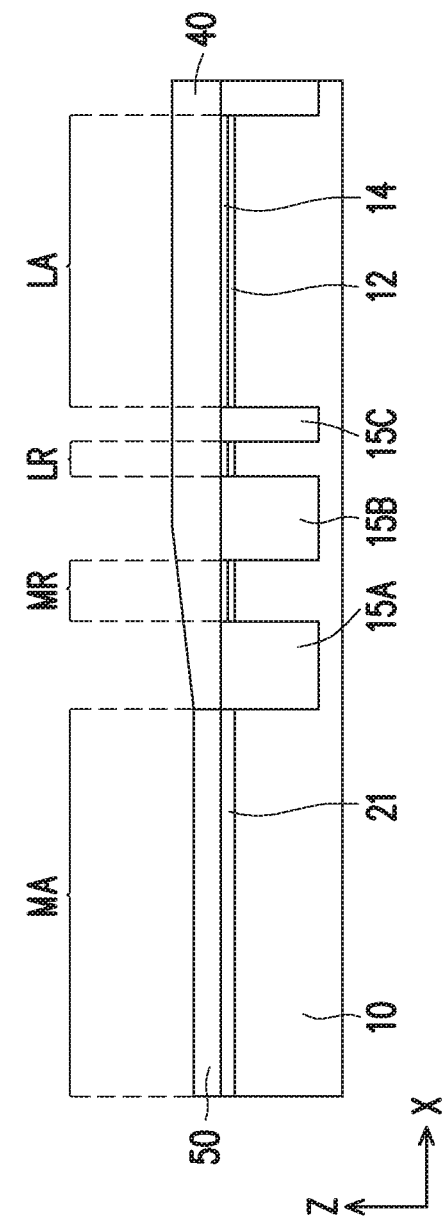
FIG. 5 shows a cross sectional view illustrating one stage of a sequential manufacturing process of a semiconductor device according to embodiments of the present disclosure.

After the blanket layer of the first poly silicon layer 50 is formed, a planarization operation, such as chemical mechanical polishing (CMP), is performed as shown in FIG. 5. By the CMP operation, the first poly silicon layer 50 in the peripheral logic circuit area is removed, and in the ring structure areas, the thickness of the hard mask 40 gradually decreases toward the memory cell area due to the step between the NVM cell are and the peripheral logic circuit area, as shown in FIG. 5.

Then, an etch-back operation is performed. By the etch-back operation, the thickness of the first poly silicon layer 50 in the memory cell area is further reduced. As shown in FIG. 6, the thickness D1 of the first poly silicon layer 50 after the etch-back operation is in a range from about 10 nm to about 100 nm in some embodiments.

Further, by using a wet etching operation, such as a HF dipping operation, the thickness of the isolation insulating layer 15A is reduced, as shown in FIG. 6. The amount of etching D2 of the isolation insulating layer 15A measured from the upper surface of the substrate 10 is in a range from about 5 nm to about 20 nm in some embodiments. It is noted that the isolation insulating layers 15B and 15C are covered by the protective layer 40.

Figure 8:
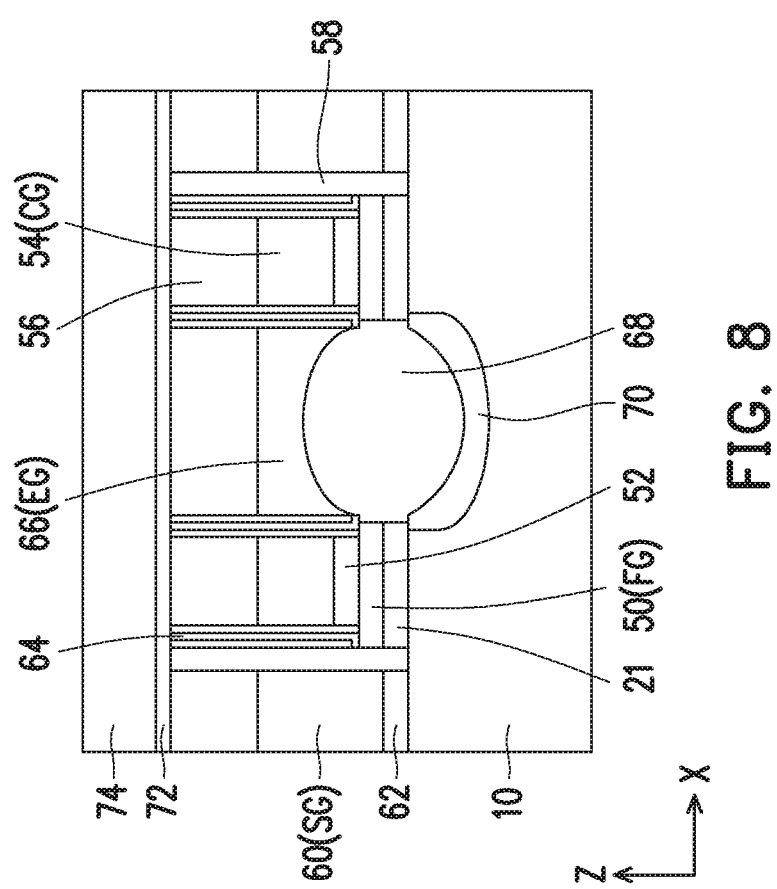
FIG. 8 shows an enlarged cross sectional view illustrating a memory cell area according to some embodiments of the present disclosure.

Then, the NVM cell structure CS is formed as shown in FIG. 7. FIG. 8 shows an enlarged cross sectional view illustrating the NVM cell structure according to some embodiments of the present disclosure.

Before forming the NVM cell structure CS, the area other than the memory cell area (e.g., peripheral logic circuit area) is covered by a protective layer, such as SiN. The first polysilicon layer 50 is patterned by suitable patterning operations, thereby forming floating gate patterns (FG patterns) FG. A width of the FG pattern FG is in a range from about 20 nm to about 500 nm and a thickness of the FG pattern FG is in a range from about 20 nm to about 500 nm, in some embodiments.

After the FG pattern FG is formed, a stacked layer of a first insulating layer stack 52, a second polysilicon layer 54 (for a control gate CG) and a second insulating layer 56 for a hard mask is formed over the FG pattern FG. In some embodiments, first insulating layer stack 52 includes one or more of a silicon oxide layer and a silicon nitride layer. The first insulating layer stack 52 can include a silicon oxide-silicon nitride-silicon oxide (ONO) structure, having thicknesses of about 2-50 nm, about 2-90 nm and about 2-50 nm, respectively, in some embodiments. The thickness of the second polysilicon layer 54 is in a range from about 10 nm to about 200 nm, in some embodiments.

The second insulating layer 56 includes silicon nitride having a thickness of about 10 nm to about 500 nm in some embodiments. In certain embodiments, the second insulating layer 56 has a stacked structure of a silicon nitride layer having a thickness of about 5 nm to about 100 nm, a silicon oxide layer having a thickness of about 5 nm to 100 nm, and a silicon nitride layer having a thickness of about 10 nm to about 1000 nm, in some embodiments. These layers can be formed by CVD.

Subsequently, the stacked layer is patterned in some embodiments by using lithography and etching operations, thereby forming a gate stack structure including the first insulating layer 52, a control gate CG and the second insulating layer 56, as shown in FIG. 8.

Further, first sidewall spacers 64 (CG spacers) are formed on opposing main side faces of the stacked gate structure, as shown in FIG. 8. The first sidewall spacers 64 are made of, for example, one or more layers of SiN, $SiO_2$ and SiON, and have a thickness in a range from about 2 nm to about 100 nm in some embodiments. In some embodiments, the first sidewall spacers 64 include a silicon oxide-silicon nitride-silicon oxide (ONO) structure, having thicknesses of about 2-100 nm, about 2-100 nm and about 2-100 nm.

Further, a diffusion layer 70 and an oxide layer 68 are formed between two gate structures, and second sidewall spacers 58 (FG spacers) are formed as shown in FIG. 8. The second sidewall spacers 58 are made of, for example, one or more layers of SiN, $SiO_2$ and SiON, which may be the same or different from the first sidewall spacers, and have a thickness in a range from about 5 nm to about 100 nm in some embodiments.

Subsequently, word lines 60 (select gate SG) and an erase gate line 66 (EG) are formed as shown in FIG. 8. In some embodiments, before forming the word line, a gate dielectric layer 62, such as silicon oxide or any other suitable dielectric material, is formed. The word lines SG and the erase gate line EG are made of a conductive material, such as doped polysilicon. A thickness of the word lines SG and erase gate line EG is in a range from about 10 nm to about 200 nm in some embodiments. Further, third sidewall spaces (word line WL spacers) may be formed on sidewalls of the word lines SG.

Further, an etch-stop layer 72 and a memory cell protecting layer 74 are formed over the NVM cells as shown in FIG. 8. The etch-stop layer 72 is made of, for example silicon oxide, and the protecting layer 74 is made of, for example, silicon nitride, silicon oxynitride, poly silicon or amorphous silicon, in some embodiments.

Figure 9:
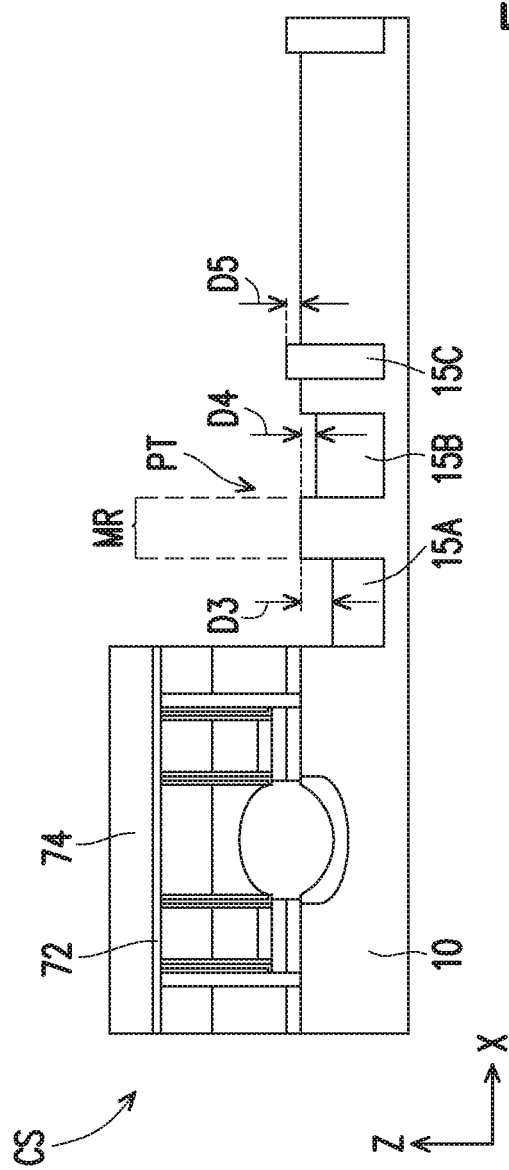
FIG. 9 shows a cross sectional view illustrating one stage of a sequential manufacturing process of a semiconductor device according to embodiments of the present disclosure.

Subsequently, as shown in FIG. 9, the hard mask layer 40, the nitride layer 14 and the pad oxide layer 12 in the ring structure and the peripheral logic circuit area are removed, by one or more etching operations. By these etching operations, the isolation insulating layers 15A, 15B, 15C are partially removed. In the ring structure area, the isolation insulating layer height is reduced, thereby forming a substrate protrusion PT. The depth D3 above the isolation insulating layer 15A from the top of the protrusion PT is in a range from about 5 nm to about 50 nm in some embodiments. The depth D4 above the isolation insulating layer 15B from the top of the protrusion PT is smaller than D3 and is in a range from about 4 nm to about 49 nm in some embodiments. In other words, a thickness of the isolation insulating layer 15A adjacent to the protrusion PT and located closer to the memory cell area is smaller than a thickness of the isolation insulating layer 15B adjacent to the protrusion PT and located farther to the memory cell area. Further, the isolation insulating layer 15C protrudes from the substrate in an amount D5 in a range from about 0.5 nm to about 30 nm in some embodiments.

Figure 10:
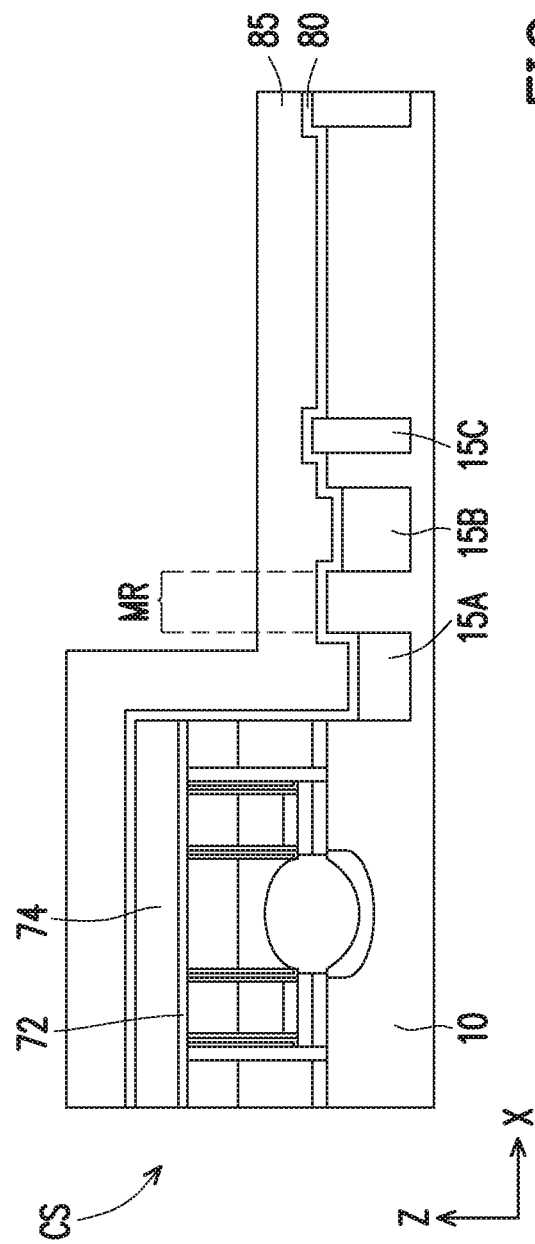
FIG. 10 shows a cross sectional view illustrating one stage of a sequential manufacturing process of a semiconductor device according to embodiments of the present disclosure.

Subsequently, a high-k dielectric film 80 and a poly silicon film 85 are formed as shown in FIG. 10. The high-k dielectric film 80 is formed in the ring structure area, thereby covering the protrusion PT and the isolation insulating layers 15A, 15B and 15C, and in the peripheral area. The high-k dielectric film 80 is subsequently used as a gate dielectric layer for the logic circuit. The high-k dielectric film 80 is made of an oxide of at least one element selected from the group consisting of Hf, Y, Ta, Ti, Al and Zr. The high-k dielectric film 80 includes $HfO_2$, HfSiO, HfSiON, HfTaO, HfTiO, HfZrO, zirconium oxide, yttrium oxide, tantalum oxide, aluminum oxide, titanium oxide, hafnium dioxide-alumina ($HfO_2$—$Al_2O_3$) alloy, other suitable high-k dielectric materials, and/or combinations thereof. In certain embodiments, $HfO_2$ is used. The high-k dielectric film 80 can be formed by CVD or atomic layer deposition (ALD). The thickness of the high-k dielectric film 80 is in a range from about 1 nm to about 10 nm in some embodiments. Further, an interfacial layer (e.g., a chemical oxide or rapid thermal oxide) is formed before the high-k dielectric film 80 is formed.

The poly silicon film 85 is subsequently used as gate electrodes for the logic circuit. The thickness of the poly silicon film 85 is in a range from about 10 nm to about 200 nm in some embodiments.

Figure 11B:
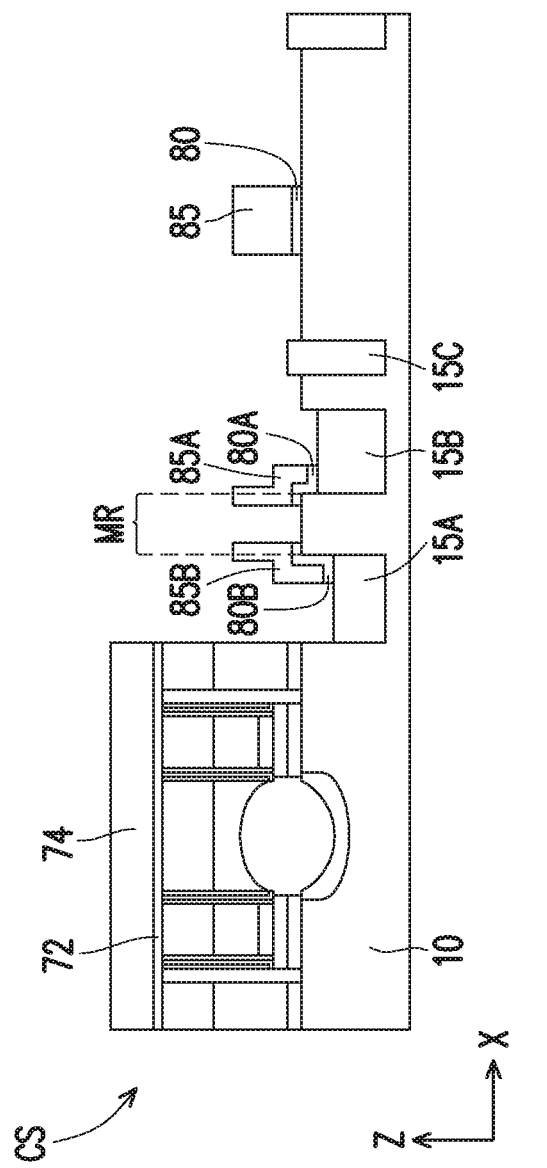

Then, as shown in FIGS. 11A and 11B, patterning operation is performed to form the gate structure having a gate dielectric layer 80 and a gate electrode 85 in the peripheral logic circuit area, as shown in FIG. 11B. FIG. 11A shows a plan view (a layout) and FIG. 11B shows a cross sectional view, corresponding to the line X1-X1 in the area A1 of FIG. 11A. Although one gate electrode 85 is shown in the peripheral logic circuit area, this is merely an illustration for simplicity, and more than one gate electrodes with various dimensions are disposed in the peripheral logic circuit area.

In the NVM ring structure area MR, the high-k dielectric films 80A and 80B are formed on the sides and part of the top of the substrate protrusion PT to cover the corners of the protrusion PT. The poly silicon layers 85A and 85B are further disposed on the high-k dielectric layers 80A and 80B respectively. The poly silicon layer in the peripheral logic circuit area and the ring structure area MR can be patterned at the same time. Accordingly, no extra photo lithography operations are required.

As shown in FIG. 11A, the poly silicon pattern has a frame shape, and an inner frame pattern 85B covering the inner edge of the ring structure MR and an outer frame pattern 85A covering the outer edge of the ring structure MR are formed with a space S1 therebetween. The width W3 of the inner frame pattern is in a range from about 10 nm to about 5000 nm and the width W4 of the outer frame pattern is in a range from about 10 nm to about 5000 nm, in some embodiments. The width W3 may be the same as or different from the width W4. The space S1 between the inner frame pattern and the outer frame patterns is in a range from about 15 nm to about 800 nm in some embodiments.

In the ring structure LR of the peripheral logic circuit area LA, no poly silicon layer and no high-k dielectric layer remains in this embodiment.

Figure 12:
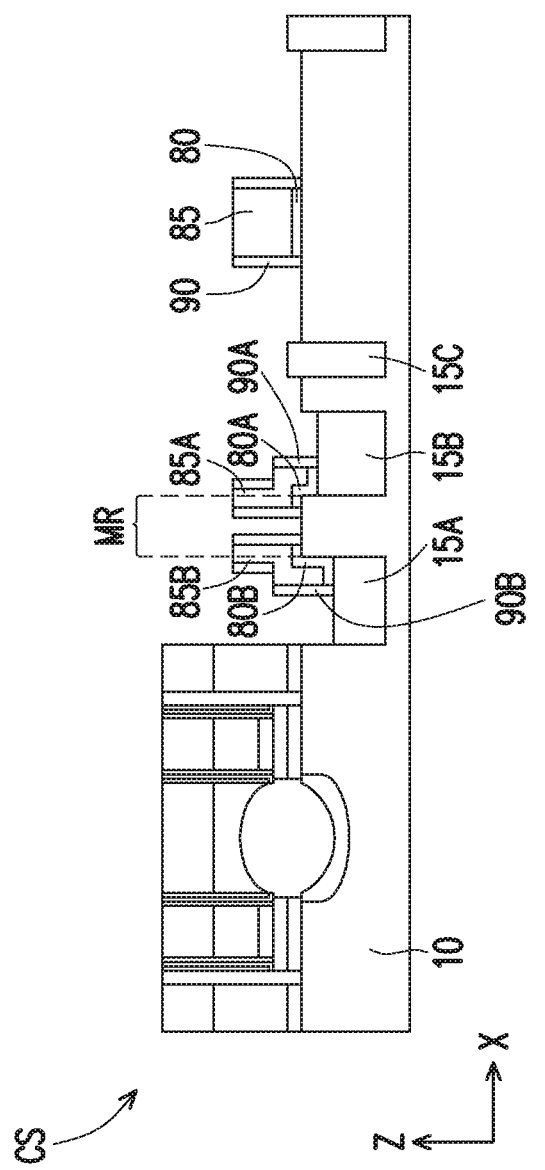
FIG. 12 shows a cross sectional view illustrating one stage of a sequential manufacturing process of a semiconductor device according to embodiments of the present disclosure.

Further, as shown in FIG. 12, the etch-stop layer 72 and the memory cell protecting layer 74 are removed, and then, sidewall spacers 90A and 90B are formed on the poly silicon layers 85A and 85B and on sides of the high-k dielectric layers 80A and 80B. By the sidewall spacers 90A and 90B, the high-k dielectric layers 80A and 80B are sealed together with the poly silicon layers 85A and 85B. The sidewall spacers 90A and 90B are made of one or more layer of silicon oxide, silicon nitride and silicon oxynitride. The thickness W5 of the sidewall spacers 90A and 90B (see, FIG. 14) is in a range from about 2 nm to about 50 nm in some embodiments. The height D6 (see, FIG. 14) of the poly silicon layers 85A and 85B and the sidewall spacers 90A and 90B from the upper surface of protrusion PT is in a range from about 5 nm to about 2000 nm in some embodiments. Sidewall spacers are also formed on sides of the select gates in the memory cell area.

In the logic circuit area, sidewall spacers 90 are formed on opposing sides of the gate electrode 85 and sides of the gate dielectric layer 80, as shown in FIG. 12.

Figure 13:
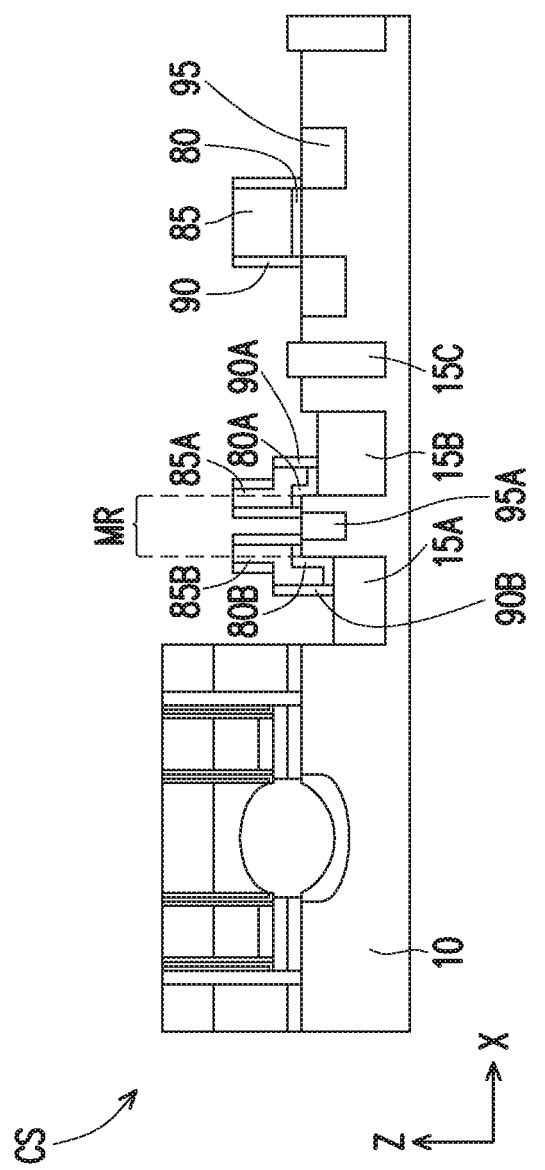
FIG. 13 shows a cross sectional view illustrating one stage of a sequential manufacturing process of a semiconductor device according to embodiments of the present disclosure.
Figure 14:
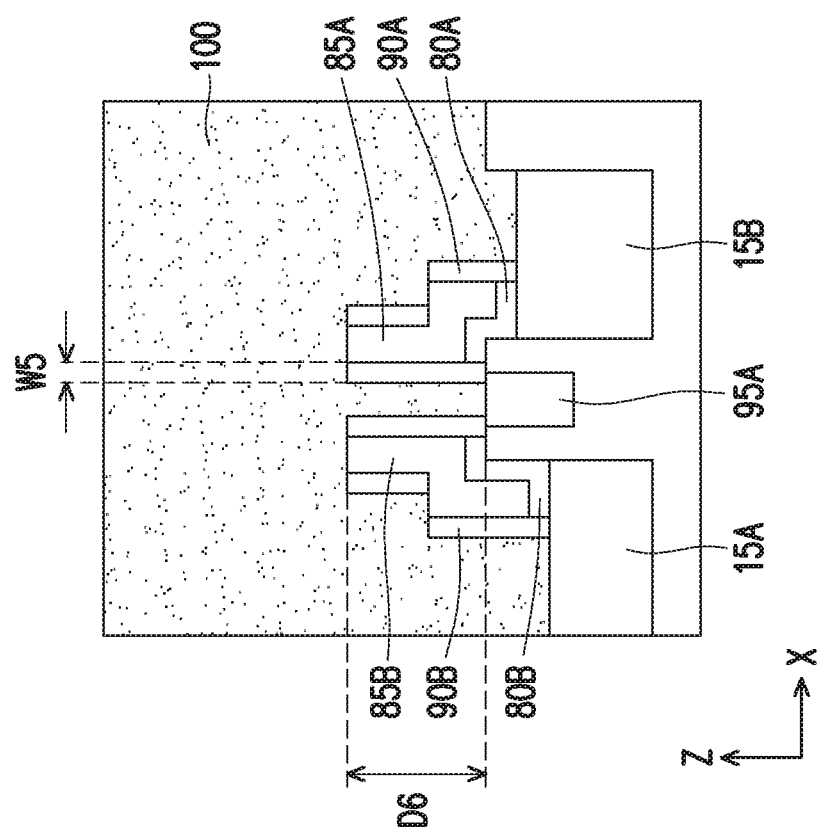
FIG. 14 shows an enlarged cross sectional view illustrating a ring structure area according to embodiments of the present disclosure.

Subsequently, a source/drain implantation is performed to form source/drain diffusion regions 95 in the logic circuit area LA and cell region MA. At the same time or by another implantation operation, the impurities are implanted into the space between the inner and outer frame patterns, where the substrate 10 is exposed, thereby forming a diffusion region 95A, as shown in FIG. 13. FIG. 14 shows an enlarged cross sectional view illustrating the memory cell ring structure. The impurities for the diffusion region 95A is $BF_2$, P, As and/or Sb. When the substrate 10 includes a p-type substrate, the diffusion region 95A is implanted by p-type impurities for applying substrate bias. The diffusion region 95A is formed in a frame shape, as a guard ring to electrically protect the memory cell area MA. In the device operation, the guard ring has the electrically same potential as the substrate in the memory cell area. In some embodiments, the impurities are also implanted into the logic area ring structure LR, thereby forming a guard ring to electrically protect the logic circuit area LA. Further, in some embodiments, an interfacial layer 82, 82A and 82B (e.g., a chemical oxide or rapid thermal oxide) is formed before the high-k dielectric film 80 is formed (see, FIGS. 18 and 19) to improve interface property. In addition, in certain embodiments, a capping layer 86, 86A and 86B is formed between the poly silicon gate layers 85, 85A and 85B and high-k dielectric layers 80, 80A and 80B (see, FIGS. 20 and 21). The capping layer is made of, for example, TiN or TaN.

Further, as shown in FIG. 14, an interlayer dielectric (ILD) layer 100 is formed over the structures of FIG. 13. The high-k dielectric layers in the memory cell ring structure are physically separated from the ILD layer 100 by the sidewall spacers 90A and 90B. In some embodiments, an etch stop layer (ESL) made of SiN is formed before forming the ILD 100. In such a case, the high-k dielectric layers in the memory cell ring structure are physically separated from the ESL by the sidewall spacers 90A and 90B.

In some embodiments, the structure shown in FIG. 14 undergoes further CMOS processes to form various features such as interconnect vias, interconnect metal layers, passivation layers, etc.

Figure 15:
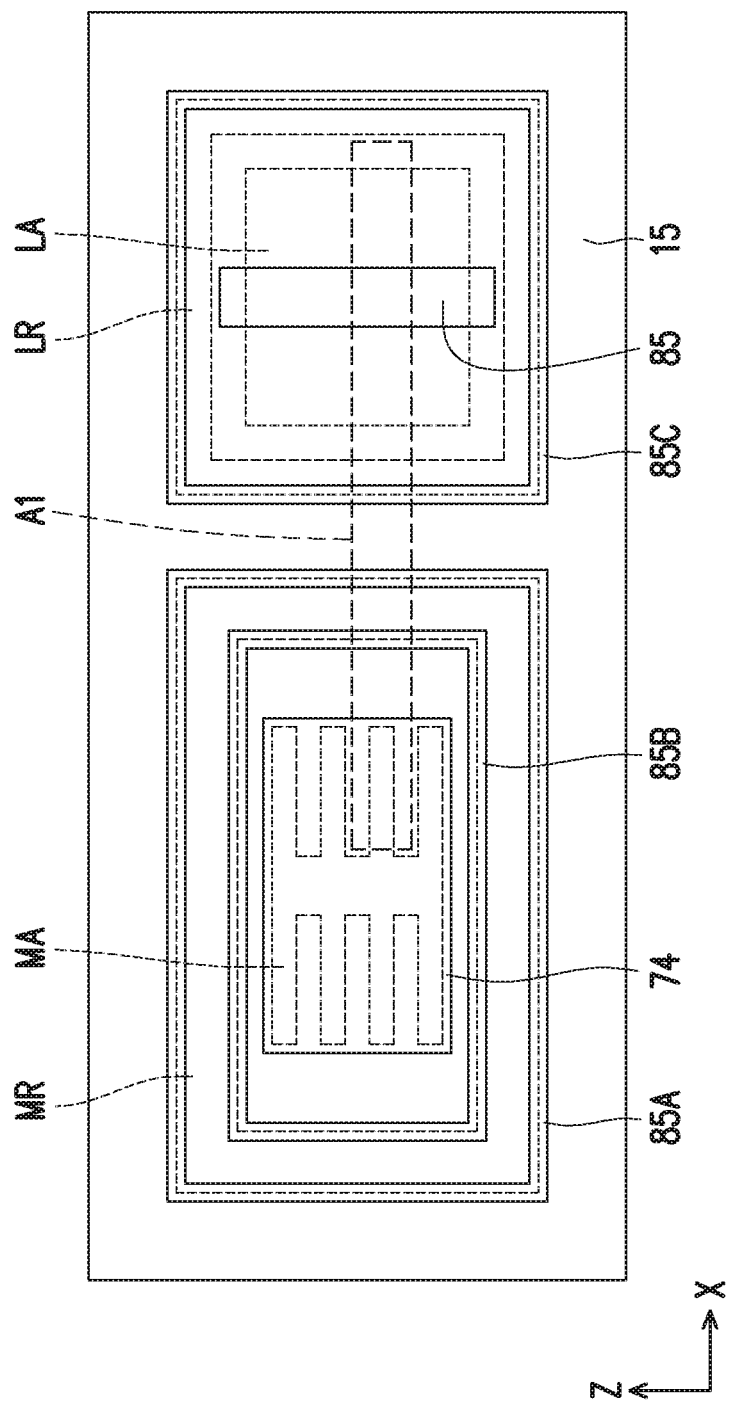
FIG. 15 shows a plan view (a layout) illustrating one stage of a sequential manufacturing process of a semiconductor device according to other embodiments of the present disclosure.
Figure 16:
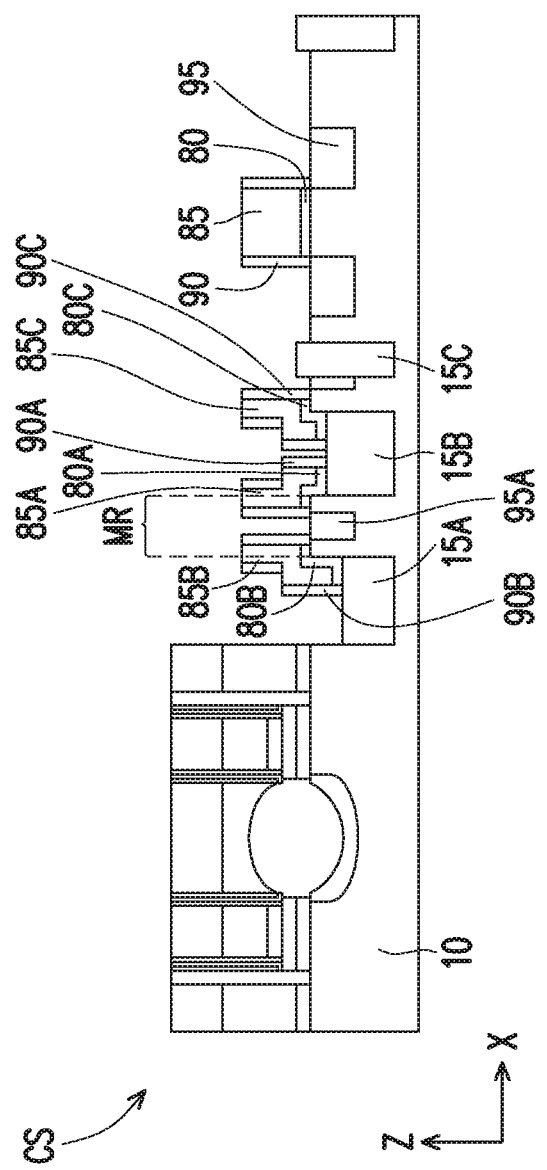
FIG. 16 shows a cross sectional view illustrating a ring structure area according to other embodiments of the present disclosure.
Figure 18:
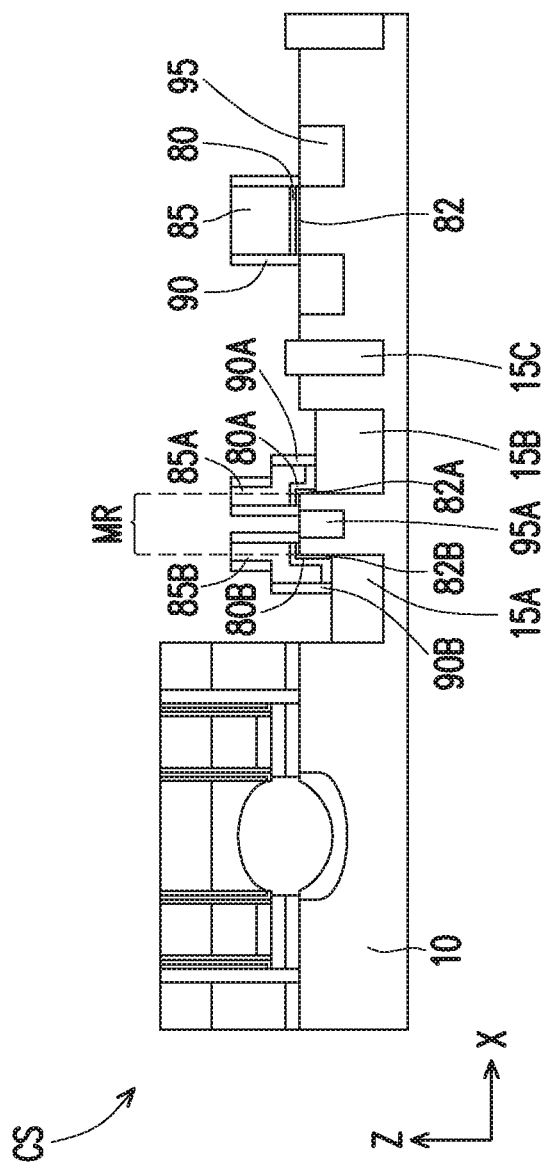
FIG. 18 shows a cross sectional view illustrating a ring structure area according to other embodiments of the present disclosure.
Figure 19:
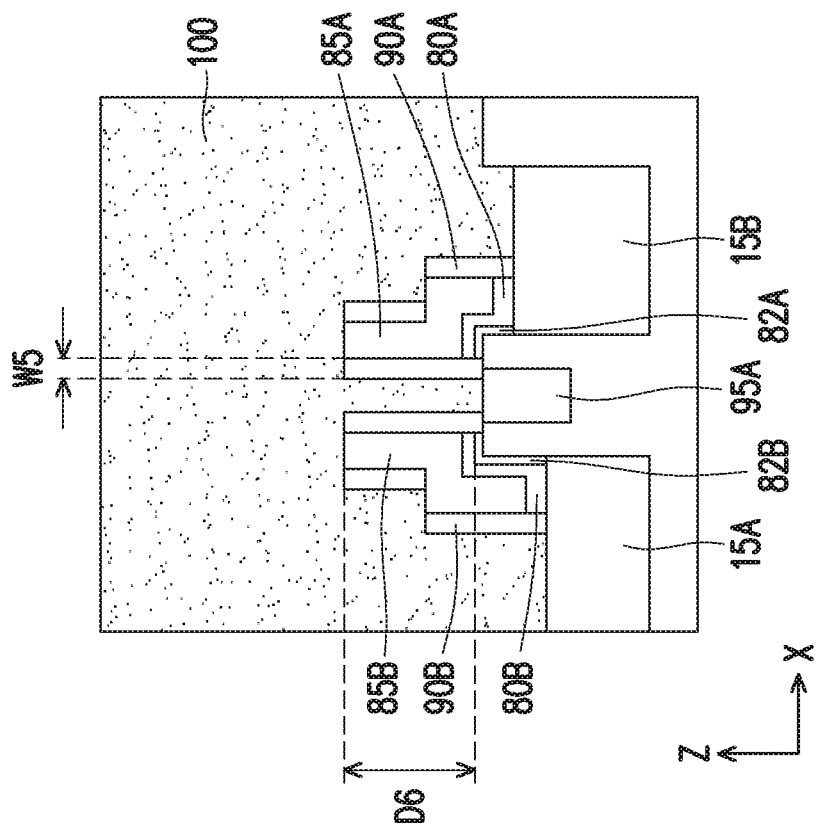
FIG. 19 shows an enlarged cross sectional view according to other embodiments of the present disclosure.

In the foregoing embodiments, in the ring structure LR of the peripheral logic circuit area LA, no poly silicon layer and no high-k dielectric layer remains in this embodiments. However, in other embodiments, a frame shaped pattern of the poly silicon layer and high-k dielectric layer is formed on at least one of an outer edge and an inner edge of the ring structure LR for the logic circuit area. FIG. 15 shows an embodiment in which a frame shaped pattern of poly silicon 85C is formed on the outer edge (the step between the silicon substrate and the isolation insulating layer 15B) of the ring structure LR. Further, as shown in FIG. 16, a residual high-k dielectric layer 80C is sealed by the poly silicon layer 85C and the sidewall spacers 90C. In other embodiments, both the inner edge and the outer edge of the ring structure LR are covered by frame shaped poly silicon layer and sidewalls, respectively. If the interfacial layer is formed as shown in FIGS. 18 and 19, the residual high-k dielectric layers 80A and 80B are sealed by the poly silicon layers 85A and 85B and the interfacial layers 82A and 82B.

Further, the foregoing methods and structures can be applied to any step where a high-k dielectric residue is formed.

Figure 17:
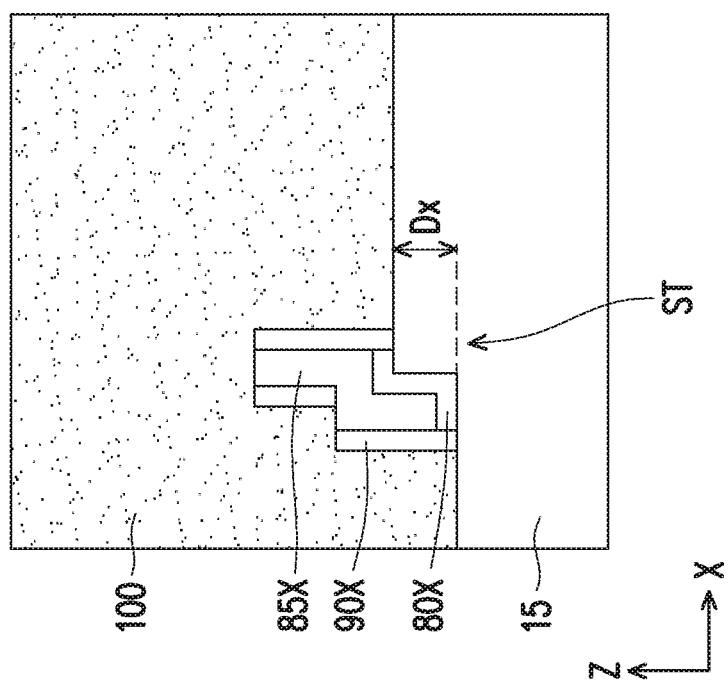
FIG. 17 shows an enlarged cross sectional view according to other embodiments of the present disclosure.
Figure 20:
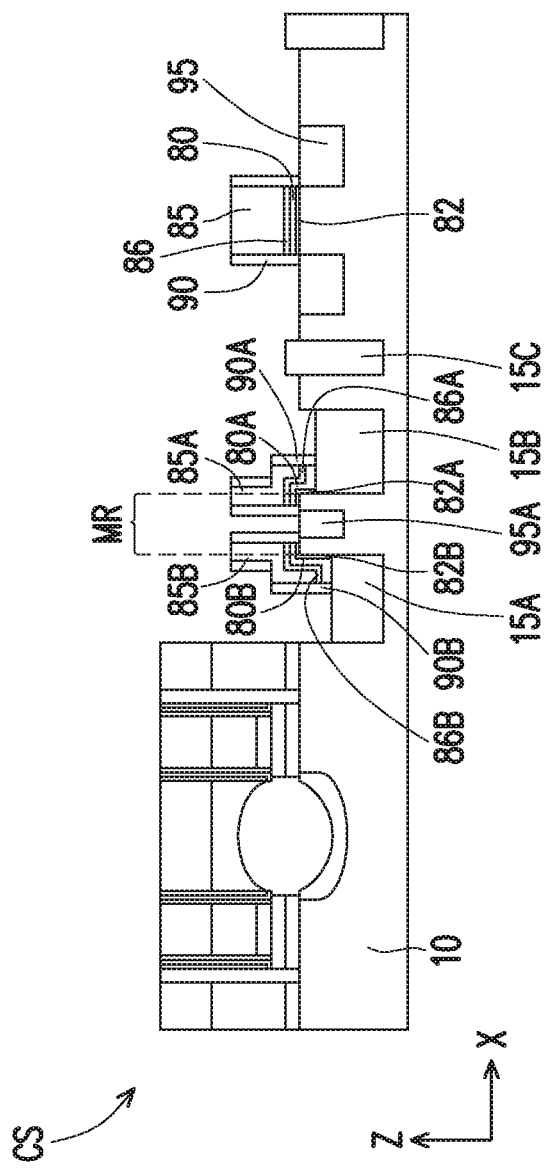
FIG. 20 shows a cross sectional view illustrating a ring structure area according to other embodiments of the present disclosure.
Figure 21:
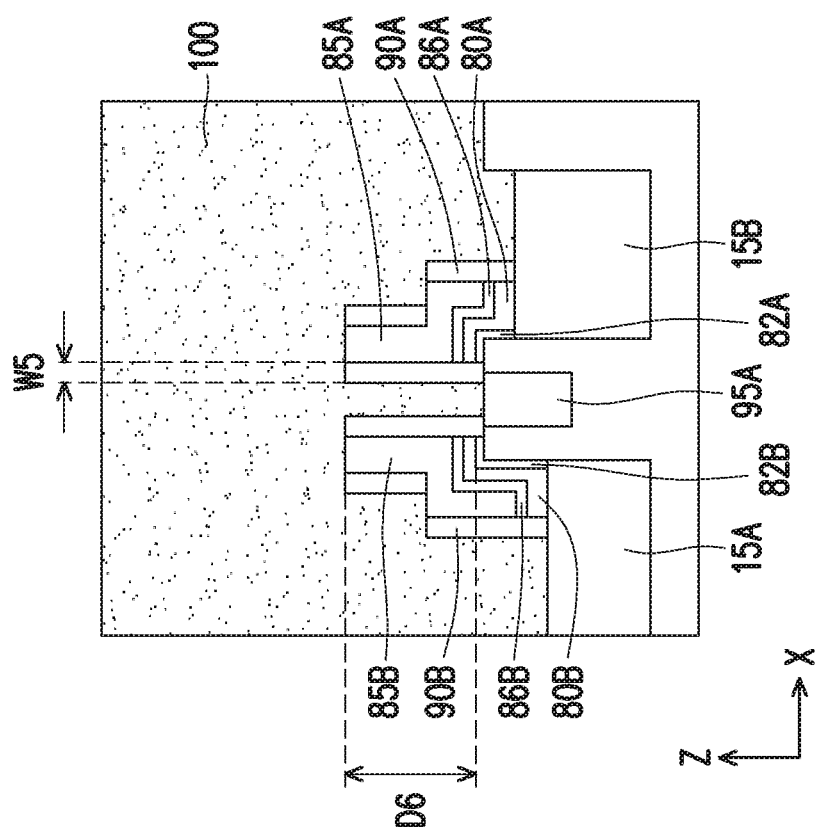
FIG. 21 shows an enlarged cross sectional view according to other embodiments of the present disclosure.

FIG. 17 shows an enlarged cross sectional view around the steps between the memory cell ring structure and the logic area ring structure according to other embodiments of the present disclosure. In this embodiment, the step ST is formed by the isolation insulating layer 15. Due to various design and/or process requirements, one or more portions of the semiconductor device include such a step structure. When the step height Dx exceed, for example, about 15 nm (e.g., 15 nm to 30 nm (or 50 nm)), a high-k dielectric residue is likely formed as an exposed sidewall, if no poly silicon cover layer is formed. If the interfacial layer and the capping layer are formed as shown in FIGS. 20 and 21, the residual high-k dielectric layers 80A and 80B are sealed by the capping layers 86A and 86B and the interfacial layers 82A and 82B.

However, by forming a poly silicon cover layer 85X to cover the edge of the step ST and by forming sidewall spacers 90X, the high-k dielectric residue 80X can be sealed from the ILD layer 100.

The step ST may be formed by various elements of the semiconductor device, such as the isolation insulating layer, the substrate and/or a dummy pattern, and such a step is formed before forming the high-k dielectric layer. It is noted that the step height (Dx) may not exceed about 300 nm in some embodiments. Further, it is noted that the poly silicon cover layer 85X generally has a frame or a ring shape surrounding another element, but the poly silicon cover layer 85X may have a bar shape.

In some embodiments, a metal gate structure using a gate replacement technology is employed. In some embodiments, similar to the foregoing embodiments, the poly silicon layers disposed over the high-k dielectric layers in the ring structure is not replaced with a metal gate structure. In other embodiments, the poly silicon layer disposed over the high-k dielectric layer in the ring structure is replaced with a metal gate structure. In certain embodiments, the poly silicon layer disposed over the high-k dielectric layer in the ring structure is partially or fully converted into a silicide layer.

It will be understood that not all advantages have been necessarily discussed herein, no particular advantage is required for all embodiments or examples, and other embodiments or examples may offer different advantages.

As set forth above, the high-k dielectric layers 80A and 80B are made of metal oxide. If the high-k dielectric material remains exposed, metal contamination may occur in the subsequent manufacturing operation. For example, a high-k dielectric residue may be formed in the sidewall of the ring structure (protrusion), because of the large step height offset between the protrusion and the isolation insulating layer. With the foregoing operations and structures, the high-k dielectric layers 80A and 80B are sealed and the metal contamination can be prevented. Further, peeling of the high-k dielectric residue can also be prevented by the method and structures of the present disclosure.

According to one aspect of the present disclosure, in a method of manufacturing a semiconductor device, the semiconductor device includes a non-volatile memory formed in a memory cell area and a ring structure area surrounding the memory cell area. In the method, a protrusion of a substrate is formed in the ring structure area. The protrusion protrudes from an isolation insulating layer. A high-k dielectric film is formed, thereby covering the protrusion and the isolation insulating layer. A poly silicon film is formed over the high-k dielectric film. The poly silicon film and the high-k dielectric film are patterned. Insulating layers are formed over the patterned poly silicon film and high-k dielectric film, thereby sealing the patterned high-k dielectric film. In an embodiment, the protrusion surrounds the memory cell area in plan view. In an embodiment, the high-k dielectric film is made of an oxide of at least one element selected from the group consisting of Hf, Y, Ta, Ti, Al and Zr. In an embodiment, a thickness of the isolation insulating layer adjacent to the protrusion and located closer to the memory cell area is smaller than a thickness of the isolation insulating layer adjacent to the protrusion and located farther from the memory cell area. In an embodiment, the poly silicon film and the high-k dielectric film are patterned such that edges of the protrusion are covered by the patterned poly silicon film and high-k dielectric film. In an embodiment, the poly silicon film and the high-k dielectric film are patterned such that a center portion of the protrusion is exposed. In an embodiment, the patterned high-k dielectric film is sealed such that an upper surface of the patterned high-k dielectric film is covered by the patterned poly silicon film and side faces of the patterned high-k dielectric film are covered by the insulating layers. In an embodiment, the insulating layers are made of at least one selected from the group consisting of silicon dioxide, silicon nitride and silicon oxynitride. In an embodiment, the protrusion is formed by filling a first trench and a second trench formed in a substrate with an insulating material, reducing a thickness of the insulating material in the first trench while maintaining a thickness of the insulating material in the second trench, and further reducing the thickness of the insulating material in the first trench and reducing the thickness of the insulating material in the second trench, thereby forming the protrusion protruding from the isolation insulating layer formed in the first and second tranches.

According to one aspect of the present disclosure, in a method of manufacturing a semiconductor device, the semiconductor device includes a non-volatile memory formed in a memory cell area, a logic circuit formed in a peripheral area and a ring structure area separating the memory cell area and the peripheral area. In the method, a memory cell structure is formed. A protrusion of a substrate is formed in the ring structure area, which protrudes from isolation insulating layers. A high-k dielectric film is formed in the ring structure area, thereby covering the protrusion and the isolation insulating layers, and in the peripheral area. A poly silicon film is formed over the high-k dielectric film. The poly silicon film and the high-k dielectric film are patterned, thereby forming a gate structure in the peripheral area, and a ring structure in the ring structure area. Insulating sidewall spacers are formed on opposing sides of the gate structure in the peripheral area and sides of the ring structure. In the ring structure area, the patterned high-k dielectric layer is sealed by the patterned polysilicon layer and the insulating spacers. In an embodiment, before the high-k dielectric film is formed, the memory cell structure is covered by a protective layer. In an embodiment, the protrusion surrounds the memory cell area in plan view. In an embodiment, the high-k dielectric film is made of an oxide of at least one element selected from the group consisting of Hf, Y, Ta, Ti, Al and Zr. In an embodiment, a thickness of the isolation insulating layer adjacent to the protrusion and located closer to the memory cell area is smaller than a thickness of the isolation insulating layer adjacent to the protrusion and located farther from the memory cell area. In an embodiment, the ring structure includes an inner ring structure covering an inner edge of the protrusion and an outer ring structure covering an outer edge of the protrusion. In an embodiment, the inner ring structure is separated from the outer ring structure by an insulating layer. In an embodiment, the patterned high-k dielectric film is sealed such that an upper surface of the patterned high-k dielectric film is covered by the patterned poly silicon film and side faces of the patterned high-k dielectric film are covered by the insulating layers. In an embodiment, the insulating layers are made of at least one selected from the group consisting of silicon dioxide, silicon nitride and silicon oxynitride.

According to one aspect of the present disclosure, a semiconductor device includes a non-volatile memory formed in a memory cell area of a substrate, a logic circuit formed in a peripheral area of the substrate, a ring structure surrounding the memory cell area and separating the memory cell area from the peripheral area, and an interlayer dielectric (ILD) layer disposed over the ring structure. The ring structure includes a first frame shaped poly silicon layer, a first dielectric layer disposed between the first frame shaped poly silicon layer and the substrate, and first sidewall spacers formed on sides of the first frame shaped poly silicon layer. The first dielectric layer is physically separated from the ILD layer by the first sidewall spacers. In an embodiment, a second frame shaped poly silicon layer surrounds the first frame shaped poly silicon layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including:
a first ring structure disposed over a substrate; and
an interlayer dielectric (ILD) layer disposed over the first ring structure, wherein:
the first ring structure includes:
a first isolation insulating layer disposed in a first trench formed in the substrate;
a first frame shaped poly silicon layer;
a first dielectric layer disposed between the first frame shaped poly silicon layer and the substrate and between the first frame shaped poly silicon layer and the first isolation insulating layer; and
first sidewall spacers formed on sides of the first frame shaped poly silicon layer, and
the first dielectric layer is physically separated from the ILD layer by the first sidewall spacers.

2. The semiconductor device of claim 1, further comprising a second ring structure surrounding the first ring structure, wherein:
the ILD layer is disposed over the second ring structure,
the second ring structure includes:
a second frame shaped poly silicon layer surrounding the first frame shaped poly silicon layer;
a second dielectric layer disposed between the second frame shaped poly silicon layer and the substrate; and
second sidewall spacers formed on sides of the second frame shaped poly silicon layer, and
the second dielectric layer is physically separated from the ILD layer by the second sidewall spacers.

3. The semiconductor device of claim 2, wherein the first dielectric layer and the second dielectric layer are made of a same material.

4. The semiconductor device of claim 3, wherein the same material is a high-k dielectric material made of an oxide of at least one element selected from the group consisting of Hf, Y, Ta, Ti, Al and Zr.

5. The semiconductor device of claim 2, wherein:
the substrate includes a protrusion,
the first dielectric layer is disposed on a top and a first side of the protrusion, and
the second dielectric layer is disposed on the top and a second side of the protrusion opposite to the first side.

6. The semiconductor device of claim 5, wherein a diffusion region is formed at the protrusion between the first ring structure and the second ring structure.

7. The semiconductor device of claim 5, wherein:
the first isolation insulating layer is disposed in an inside the ring structure,
the semiconductor device comprises a second isolation insulating layer disposed in a second trench formed in the substrate in an outside the ring structure, and
a thickness of the first isolation insulating layer is smaller than a thickness of the second isolation insulating layer.

8. The semiconductor device of claim 1, wherein:
the substrate includes a protrusion, and
the first dielectric layer is disposed on a top and a side of the protrusion.

9. A semiconductor device including:
a memory formed in a memory cell area of a substrate;
a logic circuit formed in a logic circuit area of the substrate;
a first ring structure surrounding the memory cell area and separating the memory cell area from the logic circuit area; and
an interlayer dielectric (ILD) layer disposed over the first ring structure, wherein:
the first ring structure includes:
a first frame shaped poly silicon layer;
a first dielectric layer disposed between the first frame shaped poly silicon layer and the substrate; and
first sidewall spacers formed on sides of the first frame shaped poly silicon layer, and
the first dielectric layer is physically separated from the ILD layer by the first sidewall spacers.

10. The semiconductor device of claim 9, further comprising a second ring structure surrounding the memory cell area and separating the memory cell area from the logic circuit area, wherein:
the ILD layer is disposed over the second ring structure,
the second ring structure includes:
a second frame shaped poly silicon layer surrounding the first frame shaped poly silicon layer;
a second dielectric layer disposed between the second frame shaped poly silicon layer and the substrate; and
second sidewall spacers formed on sides of the second frame shaped poly silicon layer, and
the second dielectric layer is physically separated from the ILD layer by the second sidewall spacers.

11. The semiconductor device of claim 10, wherein the first dielectric layer and the second dielectric layer are made of a same material.

12. The semiconductor device of claim 11, wherein the same material is a high-k dielectric material made of an oxide of at least one element selected from the group consisting of Hf, Y, Ta, Ti, Al and Zr.

13. The semiconductor device of claim 10, wherein:
the substrate includes a protrusion,
the first dielectric layer is disposed on a top and a first side of the protrusion, and
the second dielectric layer is disposed on the top and a second side of the protrusion opposite to the first side.

14. The semiconductor device of claim 13, wherein a diffusion region is formed at the protrusion between the first ring structure and the second ring structure.

15. The semiconductor device of claim 13, further comprising:
a first isolation insulating layer disposed in the memory cell area; and
a second isolation insulating layer disposed in the logic circuit area,
wherein a thickness of the first isolation insulating layer is smaller than a thickness of the second isolation insulating layer.

16. The semiconductor device of claim 9, wherein the memory is a non-volatile memory.

17. The semiconductor device of claim 9, wherein the first ring structure has a rectangular frame shape.

18. A semiconductor device including:
a logic circuit formed in a logic circuit area of a substrate;
a ring structure surrounding the logic circuit area; and
an interlayer dielectric (ILD) layer disposed over the ring structure, wherein:
the ring structure includes:
a frame shaped poly silicon layer;
a dielectric layer disposed between the frame shaped poly silicon layer and the substrate; and
sidewall spacers formed on sides of the frame shaped poly silicon layer, and the dielectric layer is physically separated from the ILD layer by the sidewall spacers.

19. The semiconductor device of claim 18, wherein the dielectric layer is made of an oxide of at least one element selected from the group consisting of Hf, Y, Ta, Ti, Al and Zr.

20. The semiconductor device of claim 18, wherein:
the substrate includes a protrusion,
the dielectric layer is disposed on a top and a side of the protrusion,
the semiconductor device further includes:
a first isolation insulating layer disposed over the substrate in an inside of the ring structure; and
a second isolation insulating layer disposed over the substrate in n outside of the ring structure, and
an upper surface of the first isolation insulating layer is higher than an upper surface of the second isolation insulating layer.

* * * * *